United States Patent [19]

Hernandez

[11] Patent Number: 4,908,258
[45] Date of Patent: Mar. 13, 1990

[54] HIGH DIELECTRIC CONSTANT FLEXIBLE SHEET MATERIAL

[75] Inventor: Jorge M. Hernandez, Mesa, Ariz.

[73] Assignee: Rogers Corporation, Rogers, Conn.

[21] Appl. No.: 226,619

[22] Filed: Aug. 1, 1988

[51] Int. Cl.$^4$ .............................................. B32B 27/14
[52] U.S. Cl. .................................... 428/198; 428/209;
428/210; 428/432; 428/433; 428/457; 428/325;
428/469; 428/689; 428/697; 428/901; 174/254;
361/397; 361/398
[58] Field of Search ............... 174/68.5; 361/397, 398;
428/198, 209, 210, 432, 433, 457, 901, 325, 469,
689, 697

[56] References Cited

U.S. PATENT DOCUMENTS

| 3,551,197 | 12/1970 | Lindquist, Jr. | 428/325 |
|---|---|---|---|
| 3,846,222 | 11/1974 | Dietz | 428/325 |
| 3,991,029 | 11/1976 | Adelman | 524/555 |
| 3,998,917 | 12/1976 | Adelman | 524/563 |
| 4,641,221 | 2/1987 | Khoury et al. | 361/321 |
| 4,752,857 | 6/1988 | Khoury et al. | 361/321 |
| 4,781,969 | 11/1988 | Kobayashi et al. | 428/209 |
| 4,799,996 | 1/1989 | Cassat | 162/136 |

Primary Examiner—Ellis P. Robinson
Assistant Examiner—P. J. Ryan
Attorney, Agent, or Firm—Fishman, Dionne & Cantor

[57] ABSTRACT

A high capacitance flexible dielectric sheet material is comprised of a monolayer of multilayer or single layer high dielectric (for example ceramic) chips or pellets of relatively small area and thickness which are arranged in a planar array. These high dielectric constant chips are spaced apart by a small distance. The spaces between the chips are then filled with a flexible polymer/adhesive to define a cohesive sheet with the polymer binding the array of high dielectric (for example ceramic) chips together. Next, the opposite planar surfaces of the array (including the polymer) are electroless plated or electroded by vacuum metal deposition, or sputtering, to define opposed metallized surfaces. The end result is a relatively flexible high capacitance dielectric film or sheet material which is drillable, platable, printable, etchable, laminable and reliable.

13 Claims, 4 Drawing Sheets

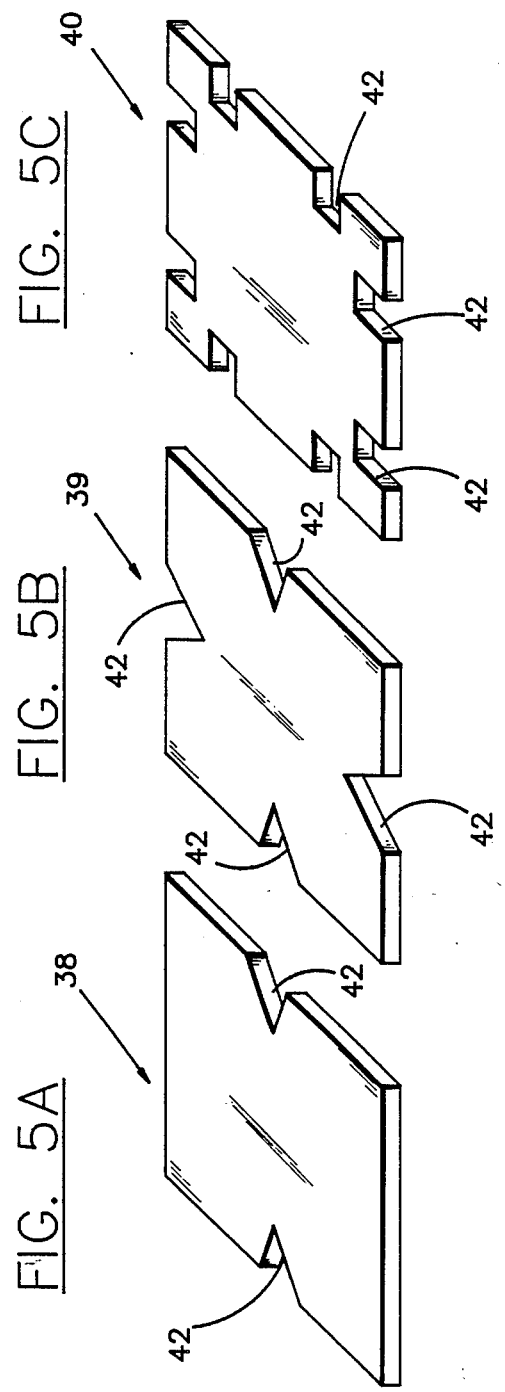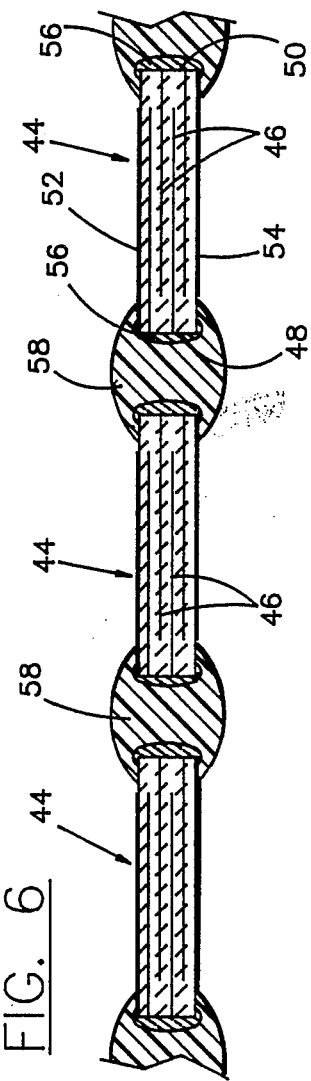

HIGH DIELECTRIC CONSTANT FLEXIBLE SHEET MATERIAL

BACKGROUND OF THE INVENTION

This invention relates generally to a flexible high dielectric constant sheet material for use in electronic circuitry and electronic components. More particularly, this invention relates to a high dielectric constant sheet material which is flexible, drillable, platable, and is which well suited for a variety of uses including high current laminated bus bars, multilayer printed circuit boards, flexible circuits and decoupling capacitors.

It will be appreciated that there is an ever increasing need for a reliable, flexible high dielectric material which may be used for a variety of applications in electronic circuitry design and manufacture. Presently, flexible high dielectric materials of this type are manufactured by mixing small particles (for example 1-3 microns) of a high dielectric constant material into a flexible polymeric matrix. Suprisingly, the resultant effective dielectric constant of the dielectric impregnated polymer is relatively low. For example, the dielectric constant of a Z5U $BaTiO_3$ is in the range of 10,000 to 12,000. However, when such Barium Titanate is mixed with a flexible polymer such as polyimide, polyester, polyetherimide and like materials, the effective dielectric constant realizable is only on the order of 20 to 40 (depending on the loading ratio of the dielectric in the polymer).

SUMMARY OF THE INVENTION

The above-discussed and other problems and deficiencies of the prior art are overcome or alleviated by the high dielectric constant flexible sheet material of the present invention. In accordance with the present invention, a high capacitance flexible dielectric material is comprised of a monolayer of multilayer or single layer high dielectric (for example ceramic) chips or pellets of relatively small area and thickness which are arranged in a planar array. These high dielectric constant chips are spaced apart by a small distance. The spaces between the chips are then filled with a flexible polymer/adhesive to define a cohesive sheet with the polymer binding the array of high dielectric (for example ceramic) chips together. Next, the opposite planar surfaces of the array (including the polymer) are metallized (for example electroless plated or metallized by vacuum deposition, sputtering, etc.) to define opposed metallized surfaces. The end result is a relatively flexible high capacitance dielectric film or sheet material which is drillable, platable, printable, etchable, laminable and reliable.

In a preferred embodiment, the small high dielectric chips are cylindrical in shape. However, the chips may be any other suitable shape including rectangular. Also, the high dielectric chips may include punches or cutouts to improve mechanical adhesion between the chips and the polymeric binding material.

Also as mentioned above, rather than using high dielectric (ceramic) pellets, the discrete high dielectric monolayer may be comprised of an array of multilayer ceramic chips such as those disclosed at FIGS. 4 and 10 in U.S. Pat. No. 4,748,537 and at FIGS. 11-16 in U.S. Pat. No. 4,706,162, all of which are assigned to the assignee hereof and incorporated herein by reference.

The high capacitance flexible dielectric sheet of the present invention may be used in a large number of applications in the electronic circuitry design and manufacturing fields. For example, the high dielectric flexible sheet may be used for forming multilayer circuit boards, or in the manufacture of decoupling capacitors or bus bars.

The above discussed and other features and advantages of the present invention will be appreciated and understood by those of ordinary skill in the art from the following detailed description and drawing.

BRIEF DESCRIPTION OF THE DRAWINGS

Referring now to the drawings, wherein like elements are numbered alike in the several FIGURES:

FIGS. 5A, 5B and 5C are perspective views of alternative high dielectric constant pellet configurations which may be used in accordance with the present invention;

FIG. 6 is a cross-sectional elevation view of still another embodiment of the present invention utilizing multilayer capacitive elements;

DESCRIPTION OF THE PREFERRED EMBODIMENT

Figure 1:
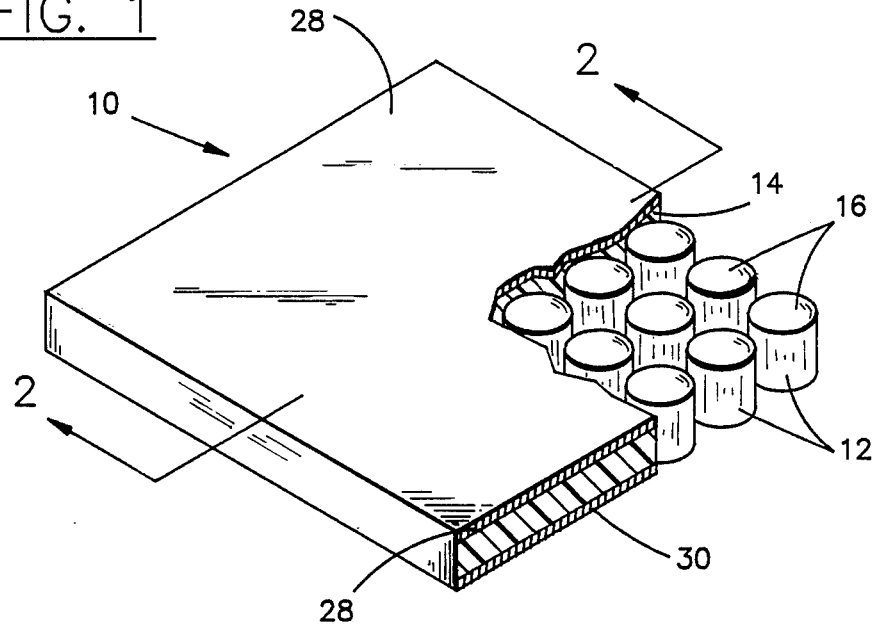
FIG. 1 is a perspective view of the high dielectric flexible sheet material of the present invention.
Figure 2:
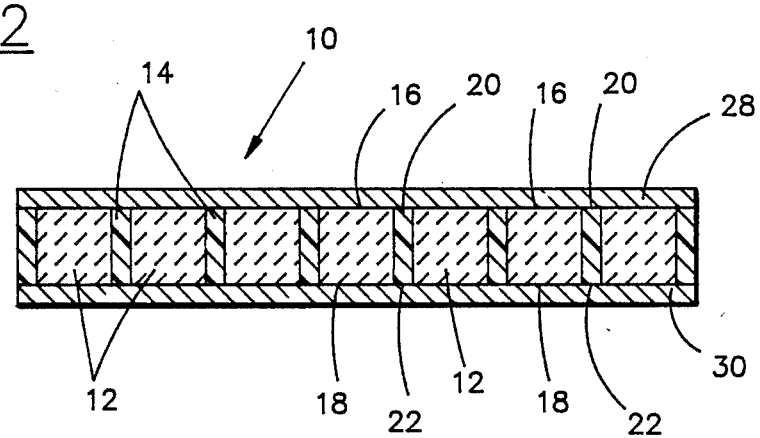
FIG. 2 is a cross-sectional elevation view along the line 2—2 of FIG. 1.

Referring first to FIGS. 1 and 2, a high dielectric constant flexible polymeric sheet material is shown generally at 10. Flexible sheet 10 is comprised of a monolayer of high dielectric constant pellets or chips 12 which are of relatively small area and thickness and are arranged in a planar array. The chips are separated from each other by a small distance to define spaces therebetween. The spaces between the chips 12 are filled with a suitable polymeric material 14. Polymeric material 14 will act as a binder to hold the array of high dielectric constant pellets 12 together. Significantly, polymeric material 14 will contact only the sides of pellets 12 and will be out of contact with the top and bottom surfaces 16 and 18 of each pellet 12. This will result in both end surfaces 16, 18 of high dielectric pellets 12 and end surfaces 20, 22 of polymeric binder 14 being exposed. Next, these opposed and exposed surfaces (comprised of surfaces 16 and 20 on the one hand and surfaces 18 and 22 on the other hand) of the pellet array and polymer are metallized to define a thin (for example about 10-50 micro inches) metallized layer 24 and 26. These thin metallized layers 24 and 26 may then be plated up to higher thicknesses (for example about 1-2 mils) by well known electroplating techniques to define layers 28 and 30. The thin metallized layers may be produced using any known method including by electroless plating or by vapor deposition techniques including vacuum deposition, sputtering, etc.

The material used to produce high dielectric constant pellets 12 may be any suitable high dielectric constant material and is preferably a high dielectric constant ceramic material such as $BaTiO_3$. In addition, other known high dielectric ceramic materials may be utilized including lead magnesium niobate, iron tungsten niobate. It will be appreciated that by "high" dielectric constant, it is meant dielectric constants of over about 10,000. As mentioned, the pellets are relatively small and are preferably cylindrical in shape having a height of 0.015" and a diameter of 0.020". If a ceramic is used, the pellets should be fully sintered prior to being bonded together by the polymer.

Of course, while cylindrical configurations for the array of pellets 12 are preferred, any other suitably shaped high dielectric constant pellet may be used. For example, in FIG. 3, a flexible high capacitance sheet is shown at 32 incorporating an array of rectangularly shaped pellets 34 in a polymer matrix 36. Also, in FIGS. 5A–5C, square shaped pellets are shown at 38, 39 and 40 respectively which are provided with from two through eight slots or grooves 42. It will be appreciated that these grooves or slots will provide a stronger mechanical bond between the polymeric binder and the pellet.

The pellet array is impregnated with a suitable polymer which may be a either a flexible thermoplastic or a flexibilized thermoset (epoxy, polyetherimide, polyester, etc.) to give the array mechanical strength and electrical insulating stability with temperature, moisture, solvents, etc. The polymeric material should be a high temperature (approximately 350° F.) polymer which is somewhat flexible and has a dielectric constant of between about 4–9. Preferred materials include polyetherimides, polyimides, polyesters and epoxies. It will be appreciated that the flexibility is necessary to preclude cracking of the sheet under stress.

Preferably, the dielectric sheet is electroless plated with copper or nickel.

The resultant sheet material will have an effective high dielectric constant of better than 1,000, a small thickness (approximately 0.005"–0.015"), will be flexible, will be metallized on both sides and will be drillable and platable.

EXAMPLES

A mathematical analysis can be made to determine the effective dielectric constant of the combined pellet array and polymeric matrix.

EXAMPLE 1

For example, using a dielectric sheet as depicted in FIGS. 1 and 2 which incorporates cylindrical pellets measuring 0.020" in diameter by 0.010" in length; and assuming a sheet of one square inch having a total of about 2,500 cylinders.

Capacitance of the dielectric sheet is determined using the following formula:

$$C = \epsilon \times (\epsilon_o) \times (a/D) \times (N) \quad (1)$$

where  $C$ = total capacitance
 $\epsilon$ = relative permitivity of the dielectric
 $\epsilon_o$ = permitivity of free space
 $a$ = area of electroded part of dielectric
 $D$ = distance between two electrodes of dielectric
 $N$ = number of dielectric pellets Assuming that the pellets are made of a Z5U dielectric with a dielectric constant of 15,000, then the capacitance of such an array would be:

$\epsilon = 15,000$
$\epsilon_o = 8.85 \times 10^{-12}$
$a = 2.827 \times 10^{-7} \, m^2$
$D = 3 \times 10^{-4} \, m$
$N = 2500$
Thus:

$$C = 15,000 \times 8.85 \times 10^{-12} \times \frac{2.827 \times 10^{-7}}{3 \times 10^{-4}} \times 2500$$

or $$C = 312 \, nF/sq.-in. \text{ or } 312,500 \, pF/sq.in.$$

If an X7R dielectric (with a dielectric constant of 4500) is utilized, then using the above equation (1), the capacitance per square inch would be about 93.6 nF/sq.in.

EXAMPLE 2

Figure 3:
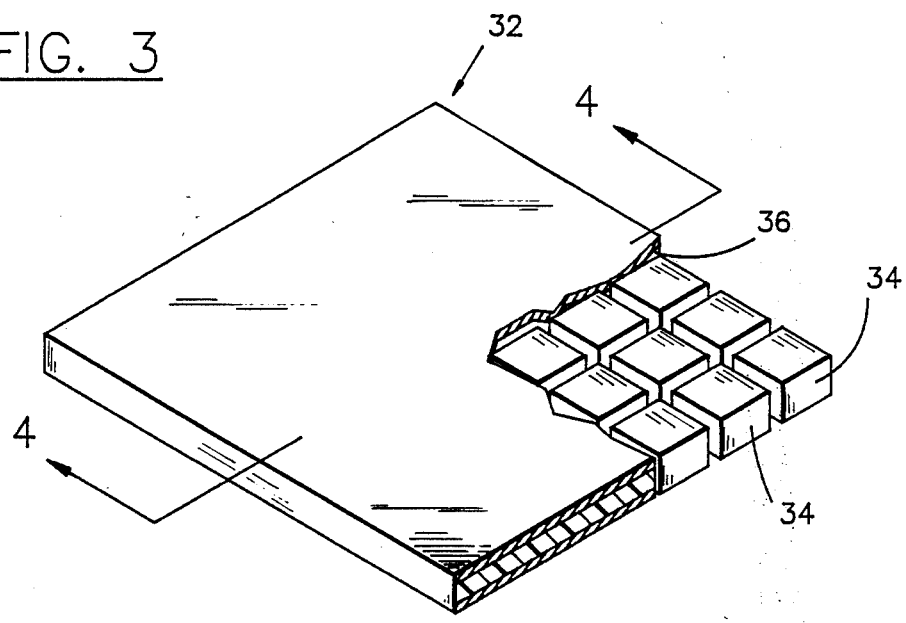
FIG. 3 is a perspective view, similar to FIG. 1, of a different embodiment of the present invention.
Figure 4:
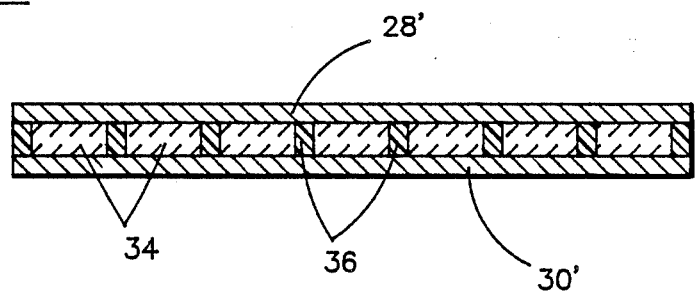
FIG. 4 is a cross-sectional elevation view along the line 4—4 of FIG. 3.

If a rectangular ceramic pellet (such as shown in FIG. 3) made from lead magnesium niobate (having a dielectric constant of 17,000) is selected with each pellet having surface area dimensions of 0.20"×0.30" and 0.015" in thickness; and with the array of pellets being spaced apart 0.020", then, using the same calculations as in Example 1, the capacitance will be 224 nF/sq.in. Alternately, if an internal boundary layer dielectric is selected with a dielectric constant of approximately 60,000 [such as $(Sr_{0.4}Ba_{0.6})TiO_3 + 10H_2O$] then the effective capacitance per square inch will be equal to 759 n F./sq.in.

Figure 7:
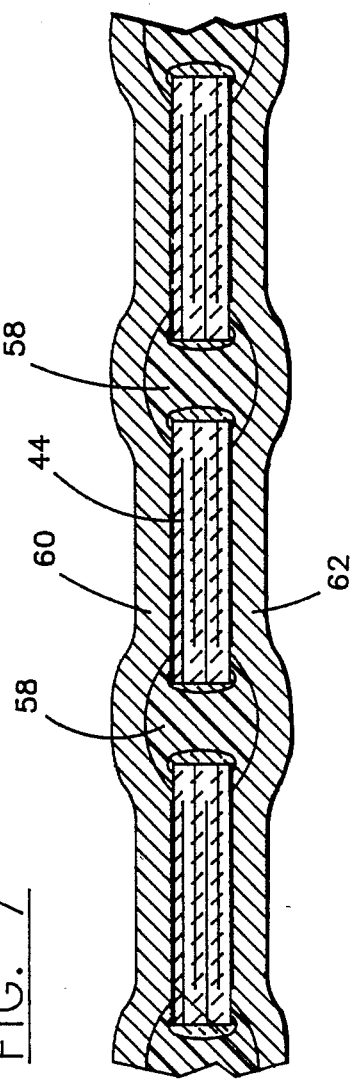
FIG. 7 is a cross-sectional elevation view similar to FIG. 6, subsequent to metallization.
Figure 8:
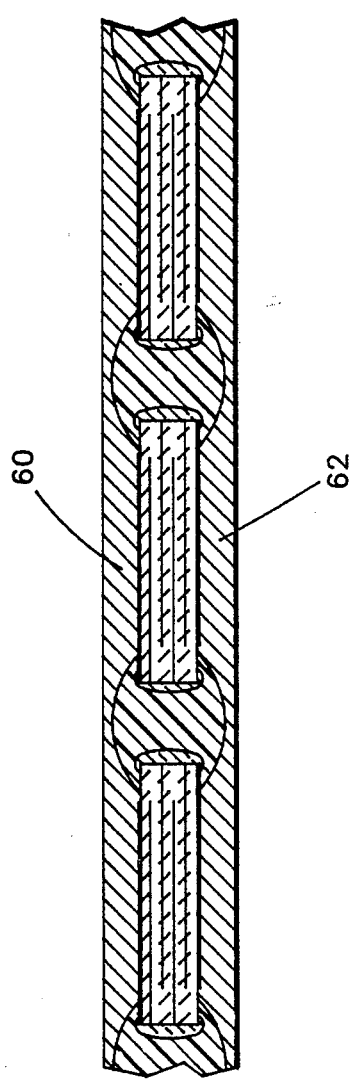
FIG. 8 is a cross-sectional elevation view similar to FIG. 7, and subsequent to additional metallization.

Still another embodiment of the present invention is shown in FIGS. 6–8. In this embodiment, rather than using high dielectric constant pellets of homogeneous composition, a multilayer capacitive element 44 is utilized. Capacitive element 44 is a known multilayer ceramic chip capacitor (such as disclosed in aforementioned U.S. Pat. Nos. 4,745,537 and 4,706,162) comprised of a plurality of metallized layers 46 with alternating layers being connected to end electrodes 48 and 50. The top and bottom surfaces of multilayer chip 44 includes exposed electrodes 52 and 54 which are also connected to opposed end electrodes 48 and 50, respectively. Finally, an insulating cap 56 is provided on each end electrode 48 and 50 to prevent shorting between an exposed top or bottom electrode 52, 54 and one of the end electrodes 48 and 50. As in the previously discussed embodiments of FIGS. 1–4, in this latter embodiment, a plurality of multilayer capacitive elements 44 are arranged in a monolayer array and a suitable polymeric adhesive 58 is used to bind the side edges of the multilayer chips 44 together. As shown in FIG. 6, this will typically result in an undulating surface between the polymer 58 and each multilayer capacitive element 44. As shown in FIG. 7, the array can then be electroless plated with copper, nickel, tin or any other suitable plating material to define thin metallized outer layers 60 and 62. Of course the undulating surface features may be eliminated by sufficiently building up the thickness of the plated electrodes and then grinding or lapping them to define a planar outer surface as in FIG. 8.

It will be appreciated that the capacitance per unit area for the FIGS. 6–8 embodiment of the present invention will depend upon the size of the chips, the number of the chips per unit area, the capacitance of individual chips and the thickness of the chips.

EXAMPLE 3

As an illustration of the levels of capacitance achievable with the embodiment of FIGS. 6–8, a flexible sheet of the type shown in FIG. 8 using multilayer capacitive elements 44 having length dimensions of 0.35", width dimensions of 0.20" and thickness dimensions of 0.018" will be discussed. The dielectric used in the capacitive element is a lead magnesium niobate dielectric wherein capacitance on an average of 1.0 micro F/chip is obtainable. Next, assuming a 0.030" gap between chips in the chip array, there would be 4.4 chips in the y direction and 3.03 chips in the x direction for a total of 13.33 chips per square inch or a total capacitance of 13.33 micro F./sq.in. This is compared to the far lower capacitance obtained from using the embodiment of FIG. 1 (see Example 1) of 0.312 micro F./sq.in.

The present invention thus provides a high effective dielectric constant sheet material which is also relatively flexible and well suited for a variety of applications. Moreover, the high DK flexible dielectric sheet is also drillable, platable, printable, etchable, laminable and has a high reliability by virtue of the capacitive elements comprising only a single layer. Also, the present invention would be relatively easy to manufacture at a low cost. If dimensioned properly, the present invention would also have very low inductance.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A high dielectric constant flexible sheet comprising:
   an array of spaced high dielectric chips arranged in a single layer, each of said chips having side, top and bottom surfaces;
   a binder comprising a flexible thermoplastic polymer or a flexibilized thermoset polymer between said side surfaces of said chips and binding said chips to define a cohesives sheet having opposed first and second planar surfaces with said top and bottom surfaces of said chips being exposed on said respective first and second surfaces;
   a first metallized layer on said first planar surface; and
   a second metallized layer on said second planar surface.

2. The sheet of claim 1 wherein:
   said chips have a shape which is selected from the group consisting of cylindrical, rectangular or square.

3. The sheet of claim 1 including:
   at least one groove formed in said chips to enhance mechanical binding with said polymeric binder.

4. The sheet of claim 1 wherein:
   said chips comprise multilayer capacitive elements having exposed top and bottom electrodes which electrically contact respective of said first and second metallized layers.

5. The sheet of claim 1 wherein:
   said first and second metallized layers are comprised of a material selected from the group consisting of copper, nickel or tin.

6. A high dielectric constant flexible sheet, comprising:
   an array of spaced high dielectric sintered ceramic chips arranged in a single layer, each of said chips having side, top and bottom surfaces.
   a binder comprising a flexible thermoplastic polymer or a flexibilized thermoset polymer between said side surfaces of said chips and binding said chips to define a cohesive sheet having opposed first and second planar surfaces with said top and bottom surfaces of said chips being exposed on said respective first and second surfaces;
   a first metallized layer on said first planar surface; and
   a second metallized layer on said second planar surface.

7. The sheet of claim 6, wherein:
   said ceramic material is selected from the group consisting of barium titanate, lead magnesium niobate or iron tungsten niobate.

8. The sheet of claim 6, wherein:
   said chips comprise multilayer capacitive elements having exposed top and bottom electrodes which electrically contact said first and second metallized layers.

9. The sheet of claim 6, wherein:
   said first and second metallized layers comprise of copper, nickel or tin.

10. A high dielectric constant flexible sheet, comprising:
    an array of spaced high kielectric chips arranged in a single layer, each of said chips having side, top and bottom surfaces and having a dielectric constant greater than about 10,000;
    a binder comprising a flexible thermoplastic polymer or a flexibilized thermoset polymer between said side surfaces of said chips and binding said chips to define a cohesive sheet having opposed first and second planar surfaces with said top and bottom surfaces of said chips being exposed on said respective first and second surfaces;
    a first metallized layer on said first planar surface; and
    a second metallized layer on said second planar surface.

11. The sheet of claim 6, wherein the chips comprise barium titanate, lead magnesium niobate or iron tungsten niobate.

12. The sheet of claim 6, wherein the chips comprise multilayer capacitative elements having exposed top and bottom electrodes which eletrically contact first and second metallized layers.

13. The sheet of claim 6, wherein the first and second metallized layers comprise copper, nickel or tin.

* * * * *